US010775248B2

(12) United States Patent
Wong et al.

(10) Patent No.: US 10,775,248 B2
(45) Date of Patent: Sep. 15, 2020

(54) MEMS STRAIN GAUGE SENSOR AND MANUFACTURING METHOD

(71) Applicant: Chinese Academy of Sciences Institute of Geology and Geophysics, Beijing (CN)

(72) Inventors: Man Wong, Hong Kong (CN); Kevin Chau, Beijing (CN)

(73) Assignee: CHINESE ACADEMY OF SCIENCES INSTITUTE OF GEOLOGY AND GEOPHYSICS, Beijing (CN)

( * ) Notice: Subject to any disclaimer, the term of this patent is extended or adjusted under 35 U.S.C. 154(b) by 327 days.

(21) Appl. No.: 15/753,147

(22) PCT Filed: Jul. 8, 2016

(86) PCT No.: PCT/CN2016/000370
§ 371 (c)(1),
(2) Date: Jul. 6, 2018

(87) PCT Pub. No.: WO2017/028466
PCT Pub. Date: Feb. 23, 2017

(65) Prior Publication Data
US 2018/0299335 A1    Oct. 18, 2018

(30) Foreign Application Priority Data

Aug. 17, 2015 (CN) .......................... 2015 1 0505712

(51) Int. Cl.
*G01L 1/18* (2006.01)
*G01B 7/16* (2006.01)
(Continued)

(52) U.S. Cl.
CPC ................. *G01L 1/18* (2013.01); *B81B 7/02* (2013.01); *B81C 1/00547* (2013.01); *G01B 7/18* (2013.01);
(Continued)

(58) Field of Classification Search
CPC .... B81B 2201/0264; B81B 2203/0109; B81B 2203/0118; B81B 3/0072; B81B 7/0061;
(Continued)

(56) References Cited

U.S. PATENT DOCUMENTS 2,457,616 A    12/1948    Van Dyke et al.
7,861,575 B2    1/2011    Jun et al.
(Continued)

FOREIGN PATENT DOCUMENTS

CN    101248340 A    8/2008
CN    102583232 A    7/2012
(Continued)

OTHER PUBLICATIONS

Mohammed, et al. "Development and Experimental Evaluation of a Novel Piezoresistive MEMS Strain Sensor." IEEE Sensors Journal; vol. 11, No. 10, pp. 2220-2232, 2011.
(Continued)

*Primary Examiner* — Francis C Gray
(74) *Attorney, Agent, or Firm* — Dergosits & Noah LLP

(57) ABSTRACT

The present invention is related to a sensor. In particular, the present invention is related to a MEMS strain gauge die and its fabrication process. The MEMS strain gauge die comprises a handle, a device layer and a cap all connected together. A silicon oxide layer is formed between the handle
(Continued)

and the device layer. Another silicon oxide layer is formed between the device layer and the cap. Recesses are respectively formed on the handle and the cap and face each other. The handle recess and the cap recess are connected to form a cavity. The device layer, which spans the cavity, further comprises a bridge on which a plurality of piezoresistive sensing elements are formed. The present strain gauge die is more immune to temperature effects. It is especially suitable for operating in a high temperature environment and is capable of delivering accurate and reliable strain measurements at low cost.

20 Claims, 11 Drawing Sheets

(51) Int. Cl.
  *G01L 1/26* (2006.01)
  *B81B 7/02* (2006.01)
  *B81C 1/00* (2006.01)

(52) U.S. Cl.
  CPC .................. *G01B 7/20* (2013.01); *G01L 1/26* (2013.01); *B81B 2201/0292* (2013.01); *B81B 2203/0109* (2013.01); *B81B 2203/0118* (2013.01); *B81B 2203/0315* (2013.01); *B81C 2201/0132* (2013.01); *B81C 2201/0133* (2013.01); *B81C 2201/0176* (2013.01)

(58) Field of Classification Search
  CPC .............. B81C 1/00142; B81C 1/0015; B81C 1/00158; B81C 2203/0109; B81C 3/001; G01L 9/0052; G01L 9/0054; G01L 9/04; G01L 1/18
  See application file for complete search history.

(56) References Cited

U.S. PATENT DOCUMENTS

| | | | |
|---|---|---|---|
| 2011/0080069 A1* | 4/2011 | Cueff .................. | H01L 41/0825 310/328 |
| 2011/0159627 A1* | 6/2011 | Mantravadi ......... | B81C 1/00182 438/52 |
| 2011/0284995 A1* | 11/2011 | Kuypers ............ | H03H 9/02275 257/622 |
| 2013/0130502 A1* | 5/2013 | Sparks .................. | H01L 21/302 438/702 |
| 2013/0300812 A1* | 11/2013 | Bibl ...................... | B81C 99/002 347/159 |
| 2013/0334627 A1* | 12/2013 | Conti .................... | B81B 3/0021 257/416 |
| 2016/0138990 A1* | 5/2016 | Tanaka .................. | G01L 9/0054 73/727 |

FOREIGN PATENT DOCUMENTS

| | | |
|---|---|---|
| CN | 103708406 A | 4/2014 |
| CN | 104089642 A | 10/2014 |
| CN | 104817053 A | 8/2015 |
| CN | 104819790 A | 8/2015 |
| CN | 10521600 A | 1/2016 |
| CN | 105241369 A | 1/2016 |

OTHER PUBLICATIONS

Y. Kanda, "A Graphical Representation of the Piezoresistance Coefficients in Silicon." IEEE Transactions on Electron Devices, vol. ED-29, No. 1, pp. 64-70, Jan. 1982.

International Search Report dated Oct. 18, 2016, related to PCT Application No. PCT/CN2016/000370.

English Translation of International Search Report dated Oct. 18, 2016, related to PCT Application No. PCT/CN2016/000370.

Written Opinion dated Oct. 18, 2016, related to PCT Application No. PCT/CN2016/000370.

* cited by examiner

Step 1

Step 2

Step 3

Step 4

Step 5

Step 6

Step 7

Step 8

MEMS STRAIN GAUGE SENSOR AND MANUFACTURING METHOD

TECHNICAL FIELD

The present invention is related to a MEMS sensor. In particular, the present invention relates to a MEMS strain gauge die for measuring strains on an object.

BACKGROUND OF THE INVENTION

It is well known that the electrical resistance of a conductor varies with its dimensions. For example, if a conductor is stretched along the direction of the electrical current flow, the current path is increased while the cross-sectional area through which the current flows is reduced by the Poisson's ratio. As a result, the electrical resistance increases. This phenomenon has been widely adopted in strain gauges. In U.S. Pat. No. 2,457,616, a foil type strain gauge is described in which a thin zigzag strip of conducting material, such as, metal, is embedded in a thermoplastic foil. The foil is rigidly bonded onto a strained surface. The varying strains are coupled to the conducting material and can be inferred from the changes in the measured electrical resistance of the conducting material.

The gauge factor of a strain gauge is commonly referred to as the ratio of the relative change in electrical resistance to the relative change in length, the latter of which is defined as the mechanical strain. There exists a class of materials in which the electrical resistivity changes with strain. This is known as the piezoresistive effect. In strongly piezoresistive materials the effect can produce a gauge factor that is much larger than that attributable to geometrical changes. Foil strain gauges of either metal or alloy type are not particularly piezoresistive. Their gauge factors are rather small, which therefore results in low sensitivity that affects accuracy. Furthermore, metals and alloys typically have rather low yield strengths and are prone to fatigue. Thus they may suffer from hysteresis errors after repeated strain cycling.

Another common type of strain gauge is of the semiconductor type, for example, those which employ single crystalline silicon as the conducting material. Silicon is a superb mechanical material with high ultimate strength and is perfectly elastic up to the fracture point. Moreover, single crystalline silicon is strongly piezoresistive, resulting in a gauge factor that is typically tens of times higher than those in metal or alloy strain gauges. Despite these advantages, silicon strain gauges do have the drawbacks for being temperature sensitive, nonlinear and fragile. Moreover, single crystalline silicon is an anisotropic material in which the piezoresistive effect is directional. As a result, the electrical resistance of a silicon conductor is not only sensitive to the strain in the longitudinal direction along which the electrical current flows; but also to the transverse and shear components of strains as well. This will generate significant crosstalk and measurement errors in silicon strain gauges if not corrected.

The majority of sensors in use today are of the micro-electro-mechanical systems (MEMS) type. MEMS based sensors are typically realized with silicon micromachining that originated from integrated circuit fabrication and still shares many of its processing technologies. In addition, there are a few unique processes specifically tailored toward the fabrication of 3-dimensional microstructures. These include double-side photolithography, Deep Reactive Ion Etching (DRIE), and wafer bonding to name a few. With demonstrated advantages that include low cost, small size, high accuracy, high reliability, and high stability, MEMS sensors have become the dominant type of sensors in use for automotive, medical, industrial and consumer electronics applications. An example of an MEMS strain gauge with multiple piezoresistive sensing elements is described in A. A. S. Mohammed, W. A. Moussa, and E. Lou, "Development and Experimental Evaluation of a Novel Piezoresistive MEMS Strain Sensor," IEEE Sensors Journal, vol. 11, no. 10, pp. 2220-2232, 2011. Of particular interest are the surface trenches that are etched in the vicinity of the sensing elements to reduce (but not completely eliminate) crosstalk and to create stress concentration regions where sensor sensitivity is enhanced. However, due to the limitation of PN-junction isolation, this strain gauge is not capable of operating in environments above 150° C.

Accordingly, in the field of strain gauges, a need presently exists for an improved MEMS strain gauge which is capable of operating in high temperature environments and can measure uniaxial and biaxial strains without being affected by crosstalk.

SUMMARY OF THE INVENTION

The objective of the present invention is to overcome current technological shortcomings so as to provide a strain gauge that is highly accurate, of wide measurement range and less affected by the environment.

A MEMS strain gauge die comprising:
a handle, a device layer and a cap all connected together;
wherein a silicon oxide layer is formed between said handle and said device layer; another silicon oxide layer is formed between said device layer and said cap; a handle recess is formed on said handle and a cap recess is formed on said cap; said handle recess and said cap recess are connected to form a cavity;
said device layer, which is provided within said cavity, further comprises a bridge; a plurality of piezoresistive sensing elements are formed on said bridge.

The strain gauge die in the present invention also comprises the following optional features: Said cavity is a vacuum sealed cavity.

The two ends of said bridge are connected to opposite sides of said cavity.

Said device layer further comprises a cantilever; said piezoresistive sensing element is formed on said cantilever.

Said device layer comprises at least one said bridge and one pair of said cantilevers, said cantilevers are parallel to said bridge; two piezoresistive sensing elements are formed on said bridge and one piezoresistive sensing element is formed on each said cantilever.

Said piezoresistive sensing elements are electrically connected in a Wheatstone bridge configuration.

Said device layer comprises at least two said bridges, said bridges are mutually perpendicular to each other; and two piezoresistive sensing elements are formed on each said bridge.

Said device layer further comprises a cantilever; said piezoresistive sensing element is formed on said cantilever.

Said piezoresistive sensing elements are electrically connected in a Wheatstone bridge configuration.

A silicon oxide insulating layer is formed on the top, the bottom and along the sides of said piezoresistive sensing element.

A metal contact is provided at each of the two terminals of said piezoresistive sensing element.

Said strain gauge die uses a silicon-on-insulator construction;

said silicon-on-insulator construction comprises a top silicon layer, a bottom silicon layer, and a buried silicon oxide layer; a cavity is formed in said bottom silicon layer;

wherein said handle is formed in said bottom silicon layer, said device layer is formed in said top silicon layer, and said buried silicon oxide layer is formed between said top silicon layer and said bottom silicon layer.

Said device layer is formed on a {100} crystallographic plane of p-type silicon, said piezoresistive sensing element is oriented along a <110> crystallographic direction.

Said device layer is formed on a {100} crystallographic plane of n-type silicon, said piezoresistive sensing element is oriented along a <100> crystallographic direction.

Said device layer is formed on a {110} crystallographic plane of p-type silicon, said piezoresistive sensing element is oriented along a <110> or <111> crystallographic direction.

Said device layer is formed on a {110} crystallographic plane of n-type silicon, said piezoresistive sensing element is oriented along a <100> crystallographic direction.

Said device layer is formed on a {111} crystallographic plane of p-type silicon.

A MEMS strain gauge die fabrication process comprising the following steps:

Step 1, grow or deposit a silicon oxide layer on the top surface and bottom surface of a silicon-on-insulator wafer which was prefabricated with buried cavities in the bottom silicon layer;

Step 2, using photolithography and ion implantation, form highly conductive regions, which are highly doped, on said top silicon layer;

Step 3, using photolithography and etching, etch trenches through said top silicon layer reaching said buried silicon oxide layer to form said piezoresistive sensing elements;

Step 4, grow or deposit a layer of silicon oxide to fill said trenches;

Step 5, using photolithography and etching, etch contact holes through said silicon oxide layer on top of said highly conductive regions reaching said top silicon layer; using metal deposition, photolithography and etching, form metal interconnection patterns from said contact holes to peripheral bond pads;

Step 6, using photolithography and etching, etch trenches through said top silicon layer and said buried silicon oxide layer punching into said buried cavities in said bottom silicon layer, thus forming said freely suspended bridges and cantilevers;

Step 7, bond a cap silicon wafer which was prefabricated with recesses to said silicon-on-insulator wafer;

Step 8, using wafer dicing, cut the bonded silicon wafer into individual MEMS strain gauge dice.

The fabrication process for said recesses in said cap silicon wafer comprises photolithography and etching.

Said etching method comprises one kind or a combination of dry and wet etching methods; said dry etching method is selected from one or more of the following methods: deep reactive ion etching, reactive ion etching, or gaseous xenon difluoride etching for silicon; as well as reactive ion etching, plasma etching, or hydrofluoric acid vapor etching for silicon oxide.

Said wet etching method for silicon comprises one kind or a combination of the following etchants: potassium hydroxide, tetramethylammonium hydroxide, or ethylenediamine pyrocatechol.

Said wet etching method for silicon oxide comprises one kind or a combination of the following etchants: hydrofluoric acid or buffered hydrofluoric acid.

In comparison with the MEMS strain gauge mentioned in the prior art, the MEMS strain gauge die in the present invention has the following advantages. Firstly, in conventional MEMS piezoresistive strain gauges, the piezoresistive sensing elements are electrically insulated by reverse biased PN junctions, the leakage current of which increases exponentially with temperature. As the temperature rises above 150° C., the insulation property of the PN junction will fail. On the other hand, in the present invention, a layer of silicon oxide is provided on the top, the bottom and along the sides of the piezoresistive sensing element. As a result, each piezoresistive sensing element is completely wrapped around and fully insulated with a layer of silicon oxide insulation. Using this dielectric isolation scheme, the electrical insulation will operate even at high temperature.

Secondly, in the present strain gauge die, whereas the piezoresistive sensing elements provided on the bridge are used to sense the strain of the sensor die along the longitudinal direction of the bridge, the piezoresistive sensing elements provided on the cantilevers remain strain free. This is because the cantilever is only supported at one end but otherwise freely suspended inside the die cavity. The cantilever therefore does not undergo a deformation even when the rest of the strain gauge die deforms under external strain. Thus the piezoresistive sensing elements provided on the cantilevers are used for compensation. Specifically, by electrically connecting the sensing elements on the bridge and cantilevers together in a Wheatstone bridge configuration, temperature and other common mode errors are significantly reduced, thereby increasing the accuracy of the present strain gauge.

Lastly, in a preferred embodiment, the internal cavity inside the sensor die is sealed in vacuum. It is within this sealed cavity that all the sensing elements are located and where they are least susceptible to external interferences, such as local temperature fluctuations, and foreign contaminations, such as dust. The strain gauge die in the present invention is therefore more stable and reliable than conventional MEMS strain gauges. Furthermore, the entire strain gauge die uses a silicon construction which avoids the problems caused by the mismatch between dislike materials. It also enables the use of MEMS fabrication technologies which results in lower manufacturing cost.

DESCRIPTION OF THE PREFERRED EMBODIMENT

The illustrative embodiments of the present invention will be described in detail with reference to the accompanying drawings. Please note that the scope of the present invention is not limited to these precise embodiments described. Various changes or modifications may be effected therein by one skilled in the art without departing from the scope or spirit of the invention.

Figure 1:
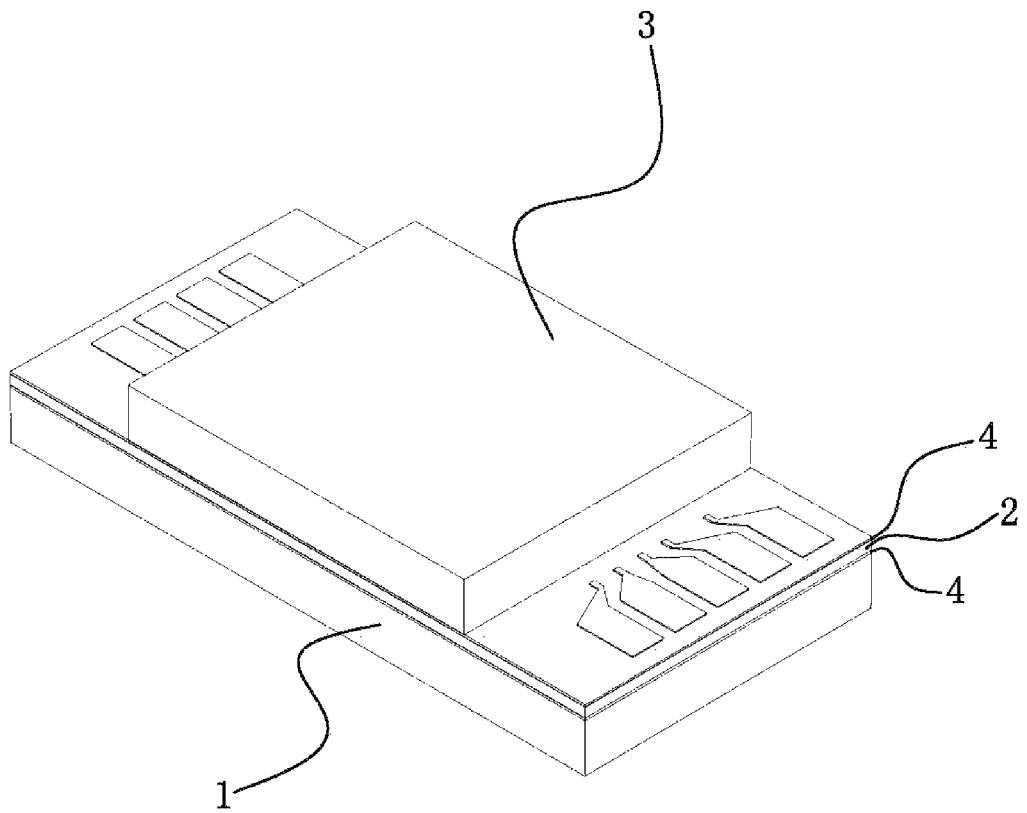
FIG. 1 is a perspective view of the strain gauge die.
Figure 2:
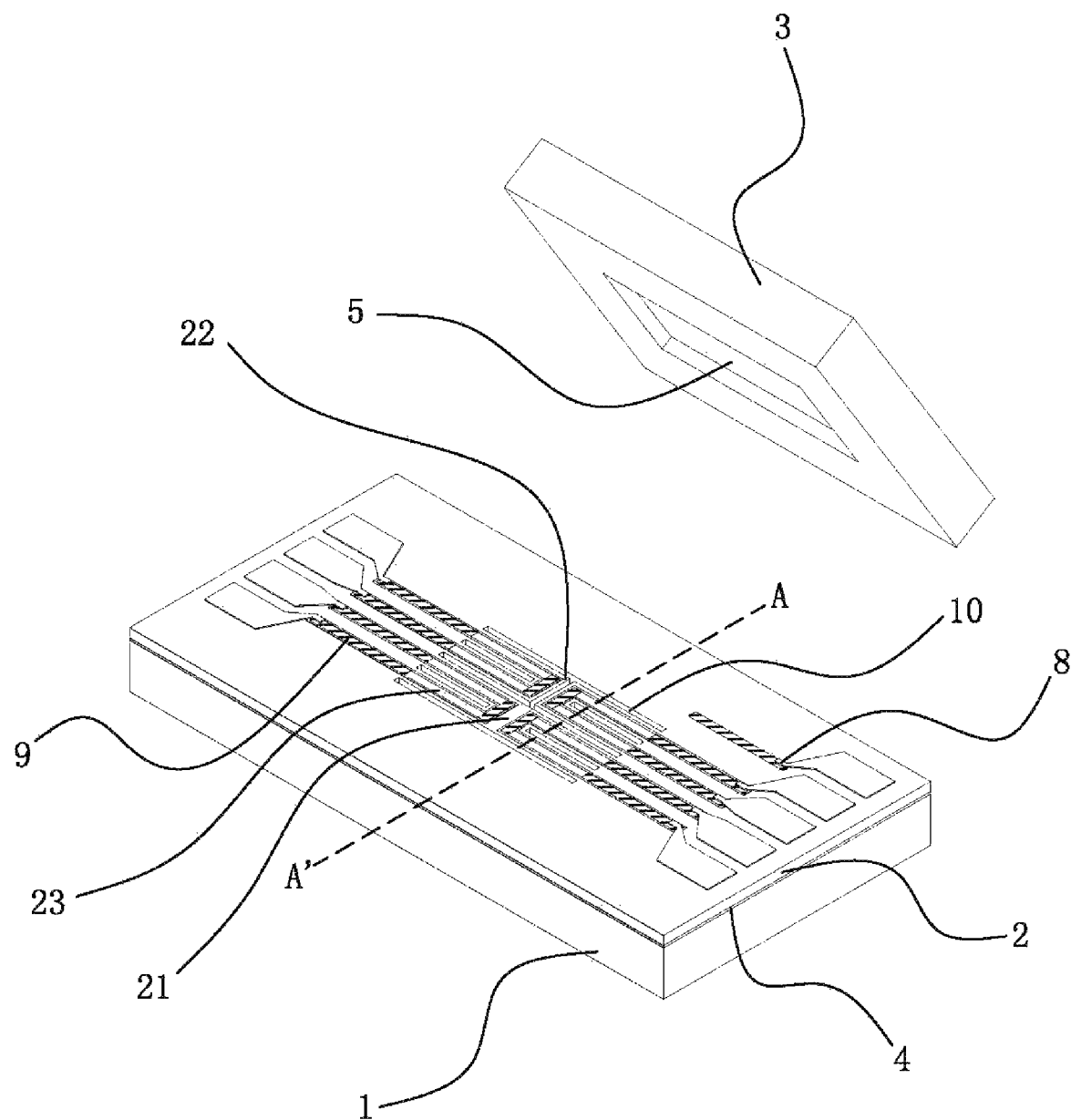
FIG. 2 is a perspective view of the strain gauge die of FIG. 1 further with the cap flipped open revealing a recess underneath and further with the top silicon oxide layer removed revealing various features on the device layer.
Figure 3:
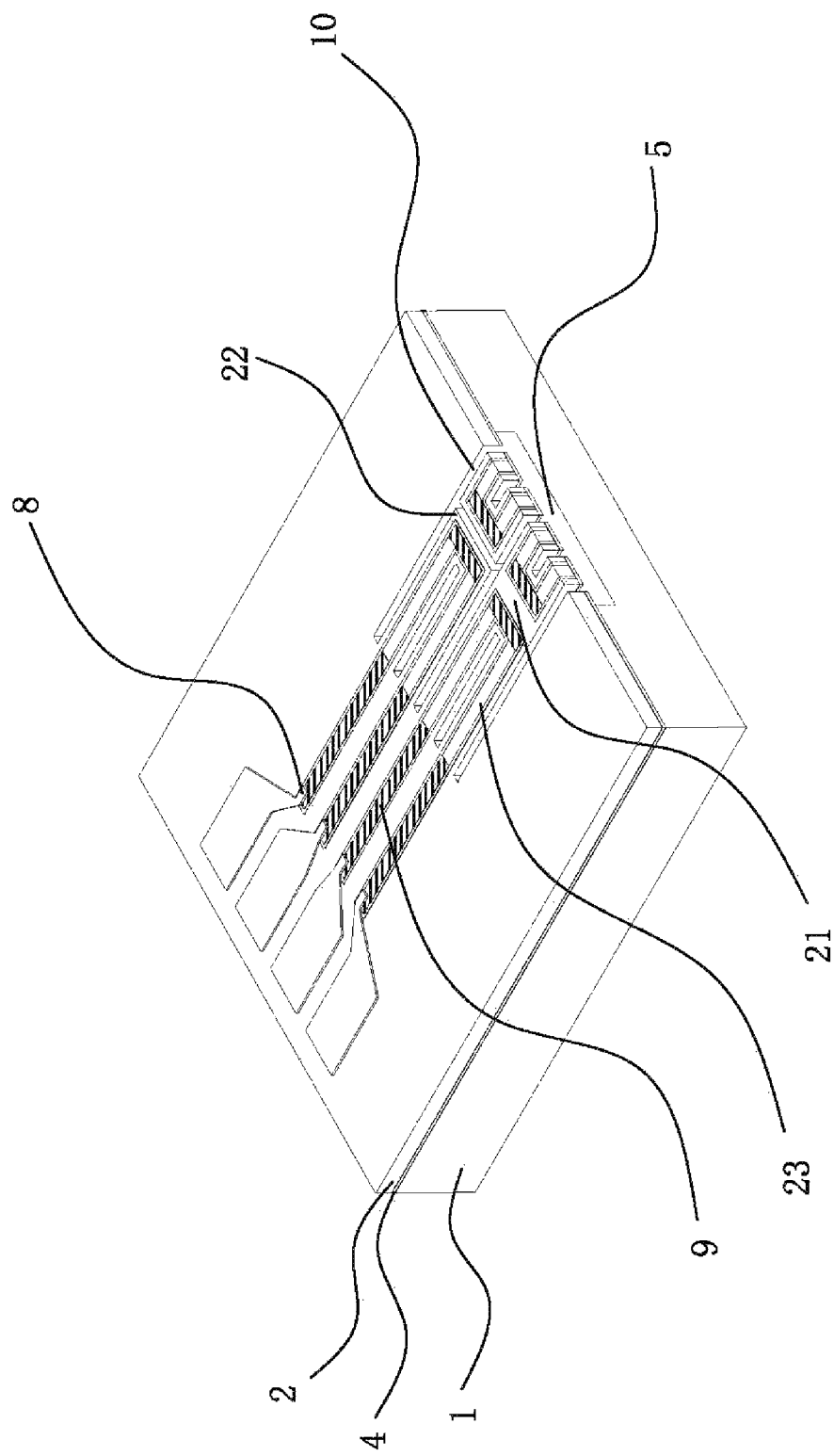
FIG. 3 is a cutaway view of the strain gauge die of FIG. 2 along line AA'.
Figure 4:
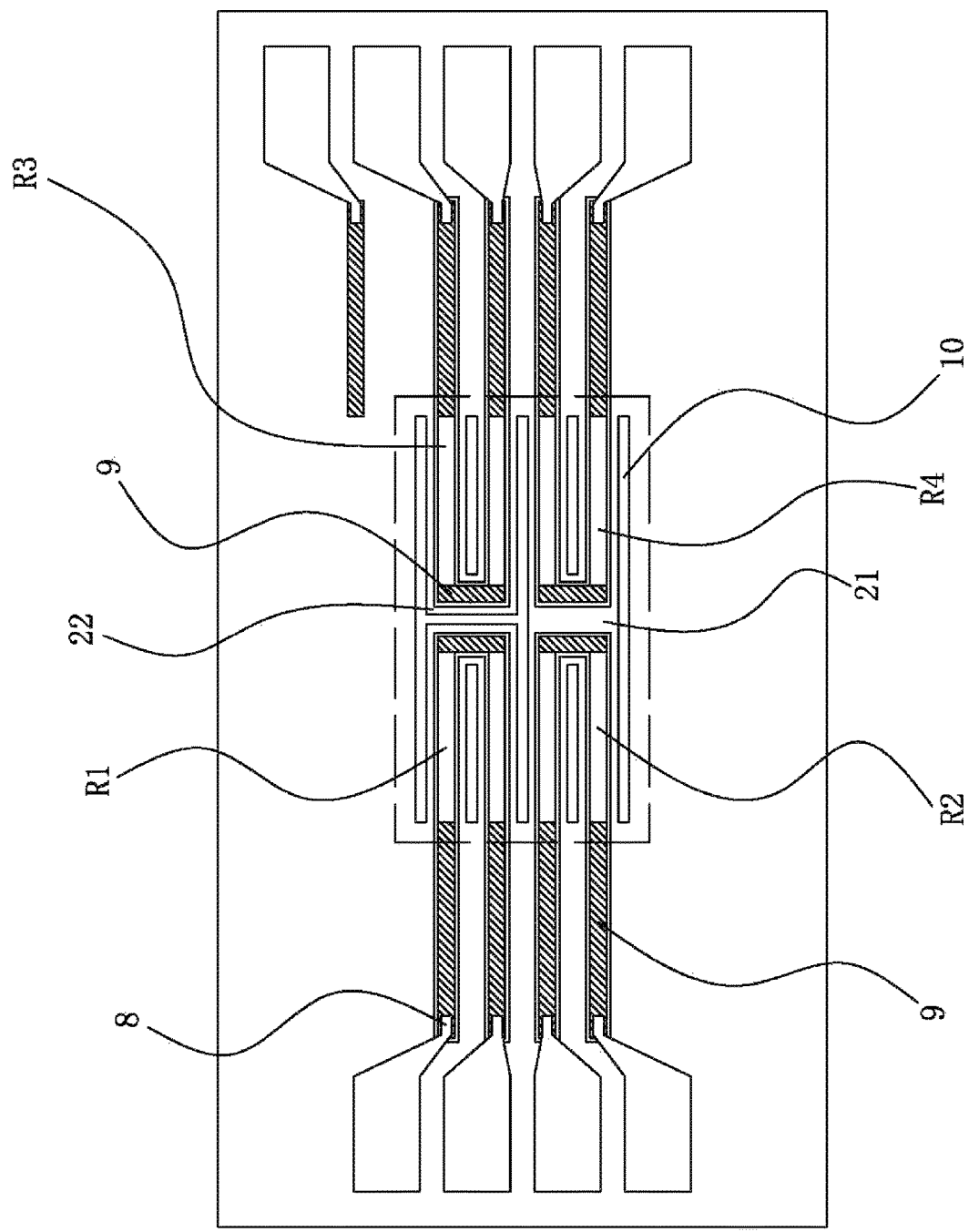
FIG. 4 is a plan view of the device layer in the first embodiment of the strain gauge die.
Figure 5:
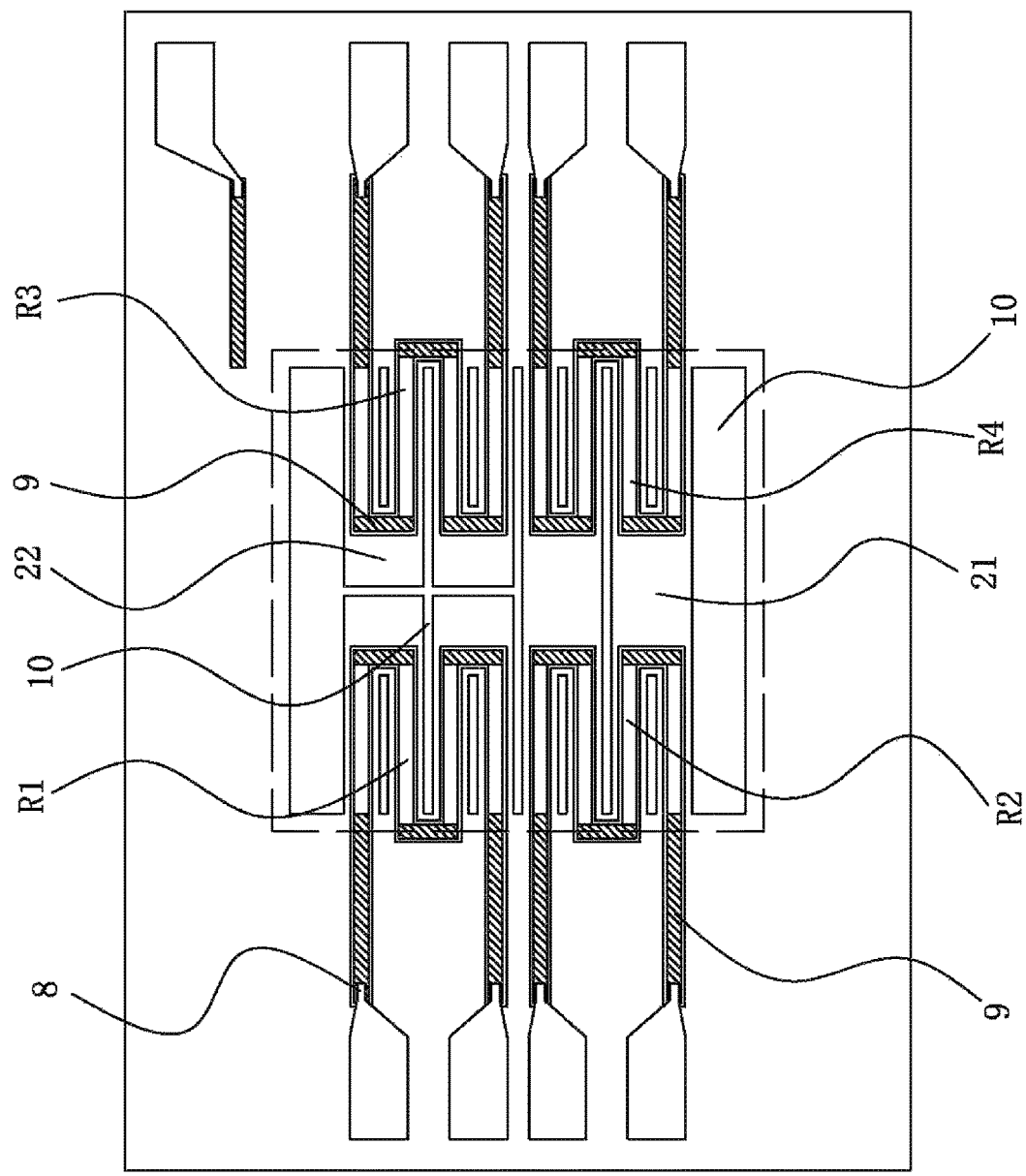
FIG. 5 is a plan view of the device layer with a serpentine piezoresistive sensing element layout in the first embodiment of the strain gauge die.
Figure 6:
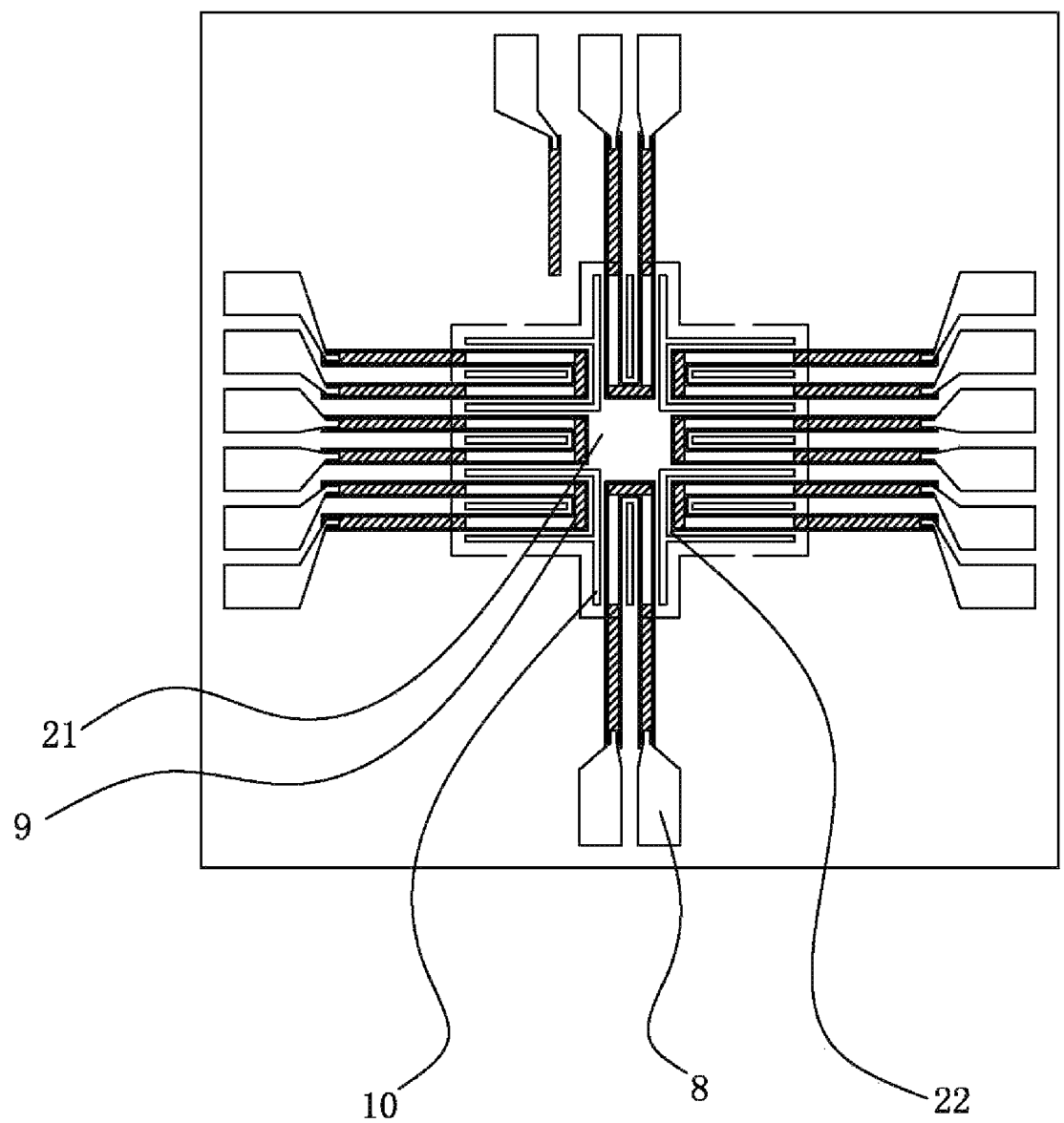
FIG. 6 is a plan view of the device layer in the second embodiment of the strain gauge die.

With reference to FIGS. 1-3, a strain gauge die is shown which comprises a handle 1, a device layer 2, and a cap 3. Silicon oxide layers 4 are respectively provided between handle 1 and device layer 2, as well as between device layer 2 and cap 3. Recesses 5 are formed respectively on handle 1 and cap 3 and face each other. Recesses 5 on handle 1 and cap 3 are connected together to form a sealed cavity. The device layer 2 is located within the sealed cavity. In FIGS. 4-6, the boundary of this cavity is illustrated by the dashed lines. Preferably, the MEMS strain gauge die is manufactured on a silicon-on-insulator (SDI) wafer. The SDI wafer comprises a top silicon layer 6, a bottom silicon layer 7, and a silicon oxide layer 4. Handle 1 is formed in the bottom silicon layer 7 wherein recess 5 is prefabricated in a prior manufacturing step. Device layer 2 is formed in the top silicon layer 6. Silicon oxide layer 4, which is formed between top silicon layer 6 and bottom silicon layer 7 in the SDI wafer, is also referred to as a "buried" silicon oxide layer and serves as the electrical insulation between top silicon layer 6 and bottom silicon layer 7. The MEMS strain gauge die is thus constructed almost entirely out of silicon, which helps reduce the measurement errors caused by the mismatch in thermal expansion coefficients between different materials. Preferably, the cavity formed by recesses 5 on handle 1 and cap 3 is a vacuum sealed cavity; this further reduces the undesirable effects of local temperature fluctuations and foreign contaminants, such as dust, on piezoresistive sensing elements 23 housed inside the cavity. Metal contacts 8 are provided on the top silicon oxide layer 4 located outside cap 3. These metal contacts 8 are respectively connected to the terminals of piezoresistive sensing elements 23 provided on the device layer 2. A separate metal contact 8, which connects to ground, is provided on the remaining area of device layer 2 which is not a part of piezoresistive sensing elements 23. External electrical circuits and components are only connected to the metal contacts 8; thus it further reduces electrical cross-talk among piezoresistive sensing elements 23.

FIGS. 1-4 illustrate the first embodiment of the strain gauge die. Device layer 2 comprises a bridge 21 and two cantilevers 22 freely suspended in the die cavity. Four piezoresistive sensing elements, R1 to R4, are provided respectively on the bridge 21 and cantilevers 22. With reference to FIG. 4, piezoresistive sensing elements R2 and R4 are provided on bridge 21, and piezoresistive sensing elements R1 and R3 are respectively provided on each cantilever 22. Bridge 21 and the two cantilevers 22 preferably have an identical layout except that the two cantilevers 22 are separated by a trench 10. As a result, the two cantilevers are freely suspended in the die cavity. The four piezoresistive sensing elements R1 to R4 also preferably have an identical layout so that when the strain gauge die is not under an external strain, the electrical resistance in R1 to R4 should be basically equal. Also preferably, silicon oxide layers 4 are formed on the top, the bottom and along the sides of piezoresistive sensing element 23; each piezoresistive sensing element 23 is therefore completely wrapped around with silicon oxide insulator.

With reference to FIGS. 2-4, the four piezoresistive sensing elements, R1 to R4, are U-shaped and identical. Highly conductive regions 9 are formed at the two terminals as well as at the turnaround corners of each piezoresistive sensing element 23. The dopant type of highly conductive regions 9 is the same as the dopant type in device layer 2. For p-type device layer, highly conductive regions 9 are of p+ type, which have a higher p-dopant concentration than that in the lightly p-doped device layer 2. This reduces the resistivity of the silicon material from approximately 0.1 Ω-cm in device layer 2 to approximately 0.01 Ω-cm, thus forming said highly conductive regions 9. The case for n-type device layer is similar except that the highly conductive regions 9 must be of n+ type instead. For each U-shaped piezoresistive sensing element 23, the layout is such that the total electrical resistance, which is the sum of the individual resistances of the lightly doped and highly doped segments, primarily comes from the two longitudinal segments that are lightly doped. In actual strain measurements, it is these two lightly doped longitudinal segments that produce the largest resistance change. By selectively reducing the resistivity of piezoresistive sensing elements 23 in the highly conductive regions 9, the fractional resistance change and hence overall sensitivity of piezoresistive sensing element 23 is greatly increased. In general, the layout of piezoresisitive sensing element 23 is not limited to one U-shaped segment. FIG. 5 illustrates an example of a serpentine layout for piezoresistive sensing element 23 comprising a few U-shaped segments.

With reference to FIGS. 1-3, in the actual application, the present strain gauge die is rigidly bonded onto the surface of an object for which strains are to be measured. This can be achieved by the use of resin adhesives or high temperature inorganic adhesives specifically designed for strain gauge bonding. Preferably, the thickness of the adhesive is thin enough so that the surface strains of the object are coupled without significant distortion into the strain gauge die. Moreover, the strain gauge die is thin enough so as not to significantly perturb the state of the strains on the object.

As the strain gauge die is subjected to an external strain, cantilevers 22 remain strain free since they are freely suspended in the die cavity. The resistance of piezoresistive sensing elements R1 and R3, which are provided on cantilevers 22, should therefore remain essentially unchanged under the external strain. On the other hand, bridge 21 is connected to the opposite sides of the die cavity, which therefore directly experiences the die strain. The resistance of piezoresistive sensing elements R2 and R4, which are provided on bridge 21, should therefore vary linearly with the normal strain along the longitudinal direction of bridge 21 to first order according to silicon piezoresistance theory. From Ohm's law, V=IR, when the current passing through piezoresistive sensing elements R2 and R4 stays constant but the resistances of R2 and R4 change, the voltages across R2 and R4 will change. Therefore, based on the measured voltage changes across R2 and R4, the magnitude of the external strain can be calculated accordingly. Besides strains, there are, however, other environmental factors, such as temperature, that may change the resistance values. In the present invention, piezoresistive sensing elements R1 and R3 are primarily used for the compensation of temperature and other common mode errors that affect all four piezoresistive sensing elements R1 to R4 by an equal amount.

Figure 7:
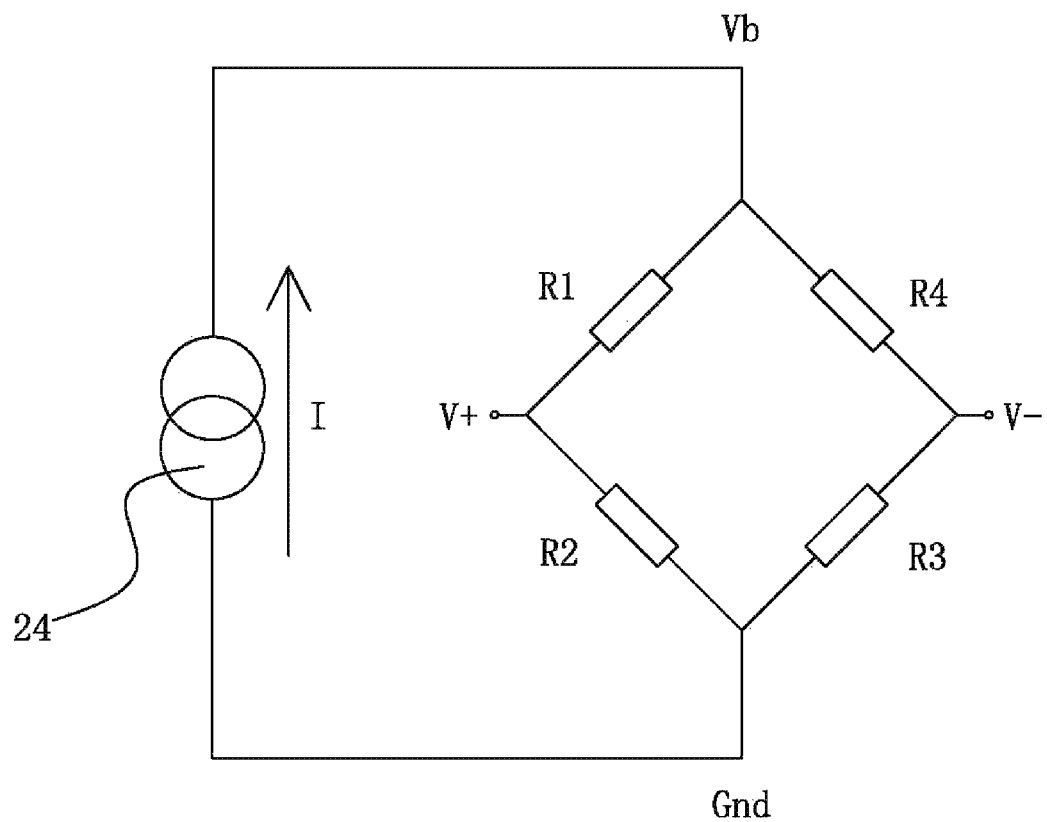
FIG. 7 is a circuit diagram of the piezoresistive sensing elements connected in a Wheatstone bridge configuration.
Figure 8A:
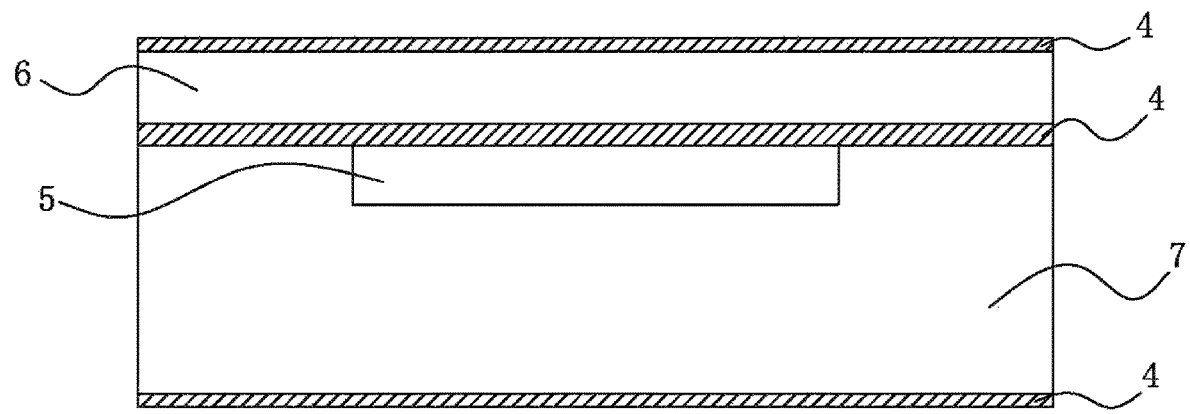
FIG. 8 is a cross-sectional view illustrating step 1 and step 2 of the fabrication process of the strain gauge die.
Figure 8B:
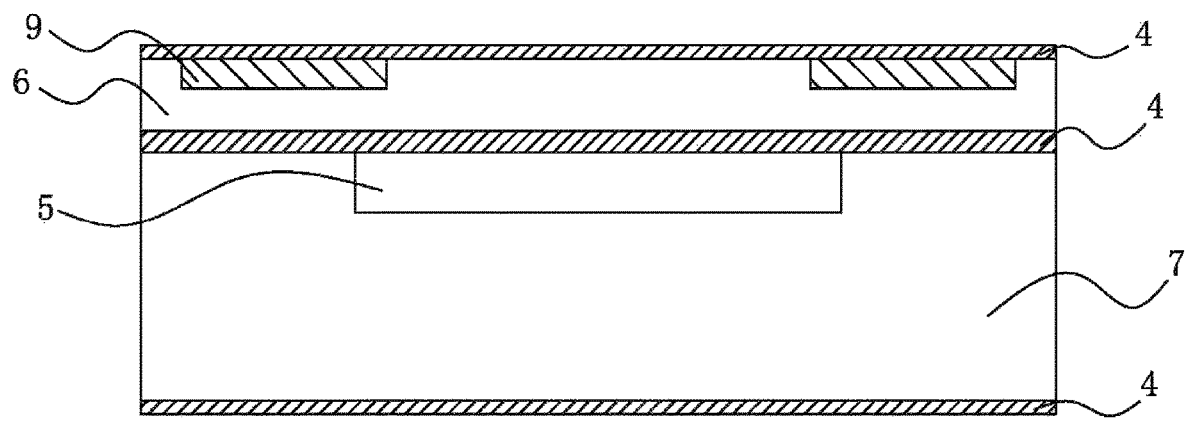
Figure 9A:
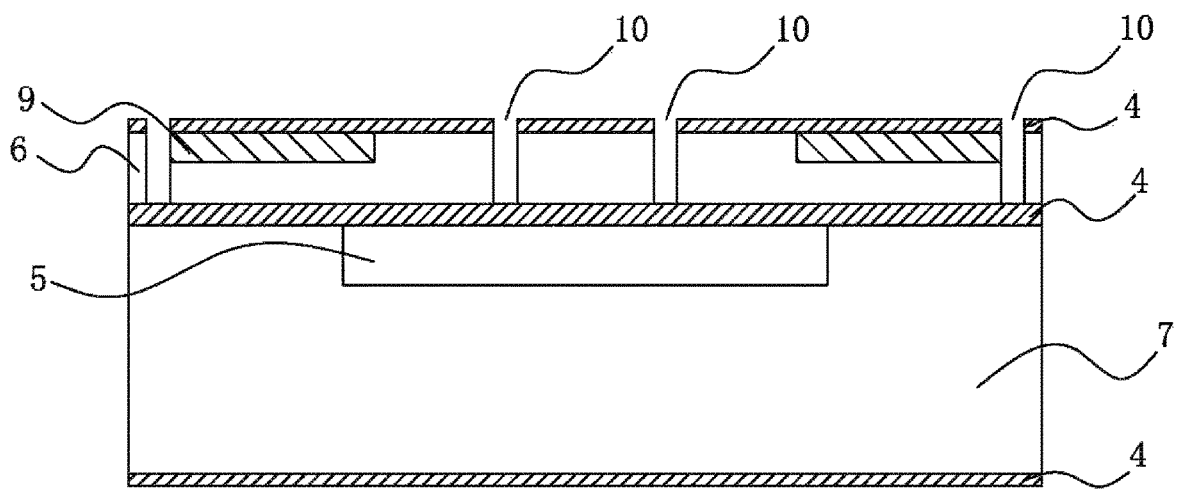
FIG. 9 is a cross-sectional view illustrating step 3 and step 4 of the fabrication process of the strain gauge die.
Figure 9B:
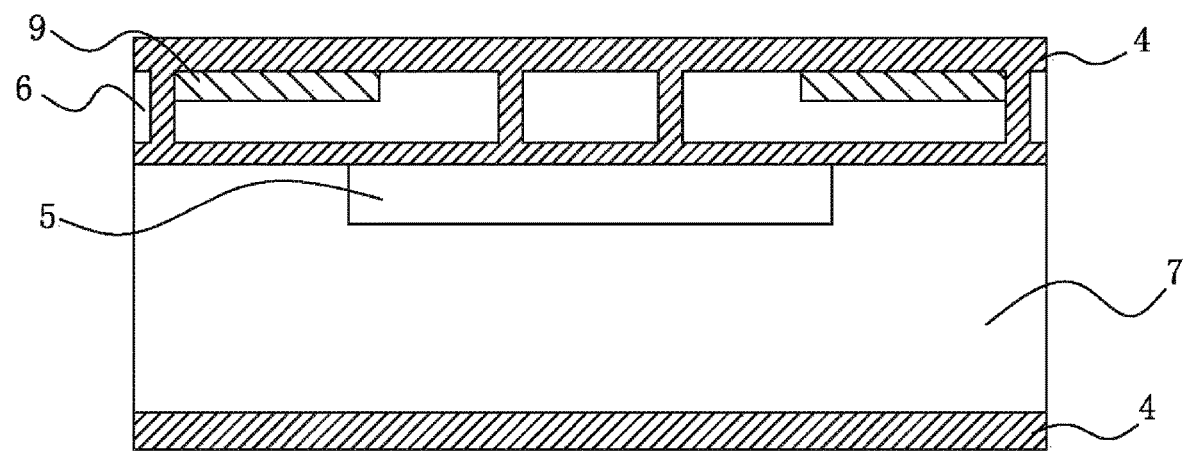
Figure 10A:
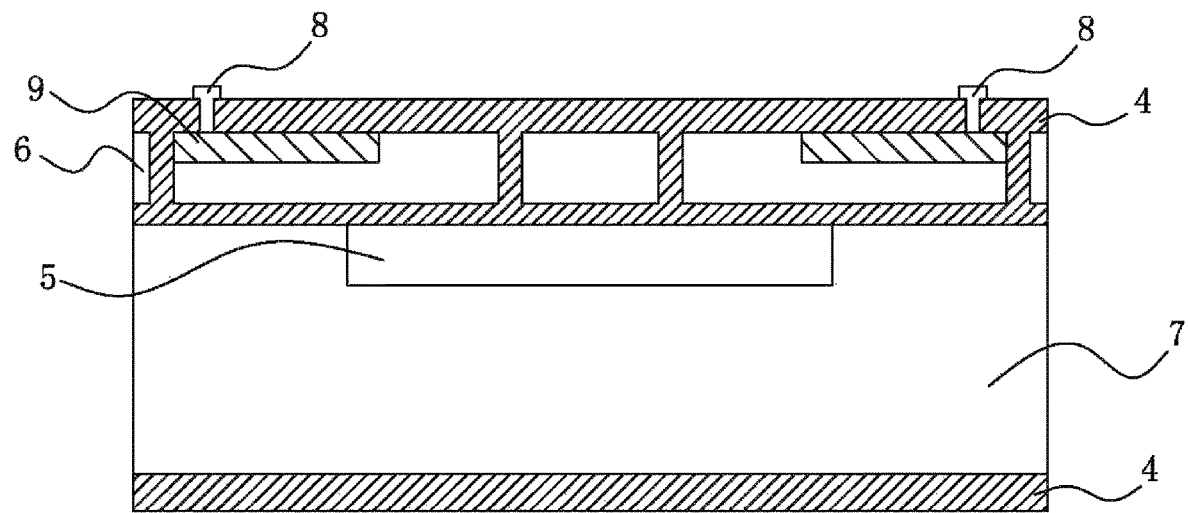
FIG. 10 is a cross-sectional view illustrating step 5 and step 6 of the fabrication process of the strain gauge die.
Figure 10B:
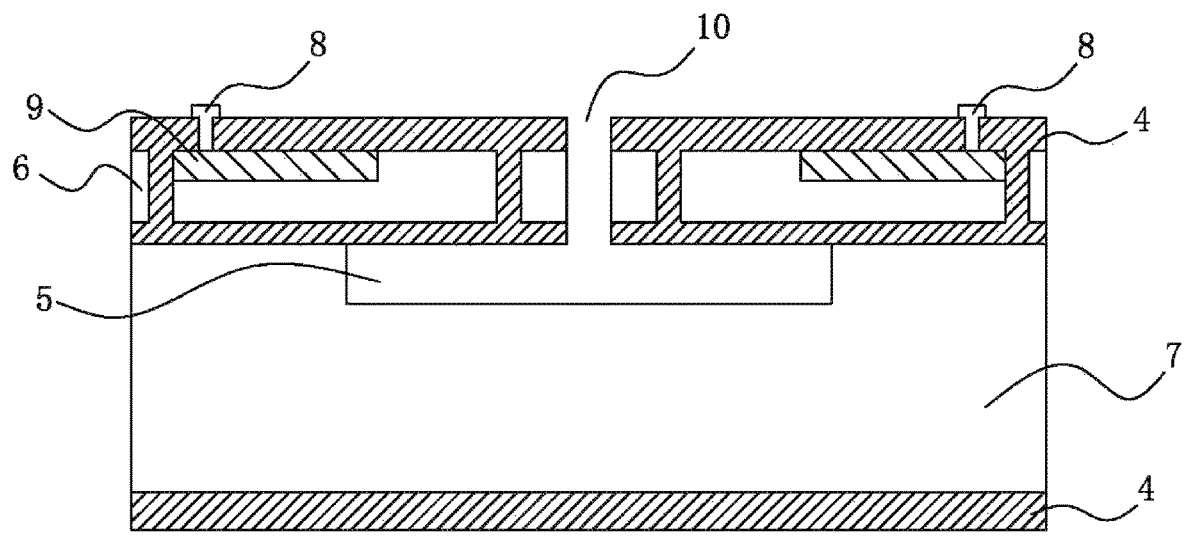
Figure 11A:
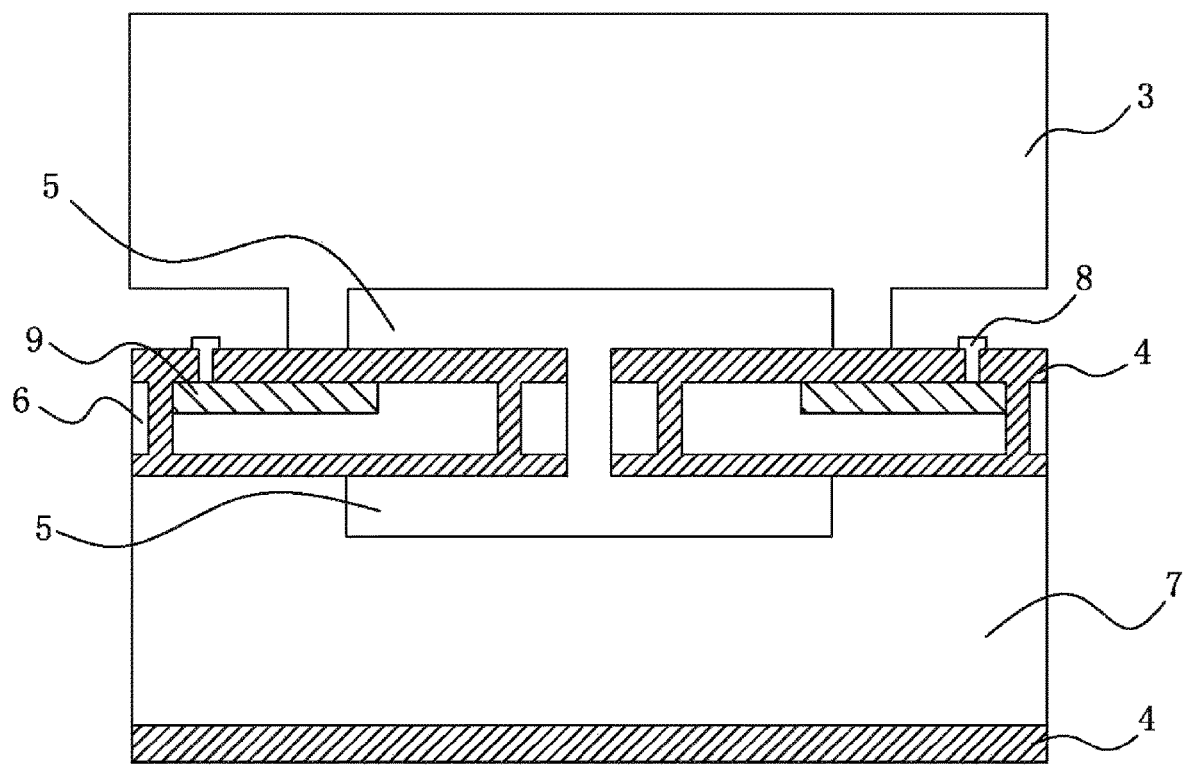
FIG. 11 is a cross-sectional view illustrating step 7 and step 8 of the fabrication process of the strain gauge die.
Figure 11B:
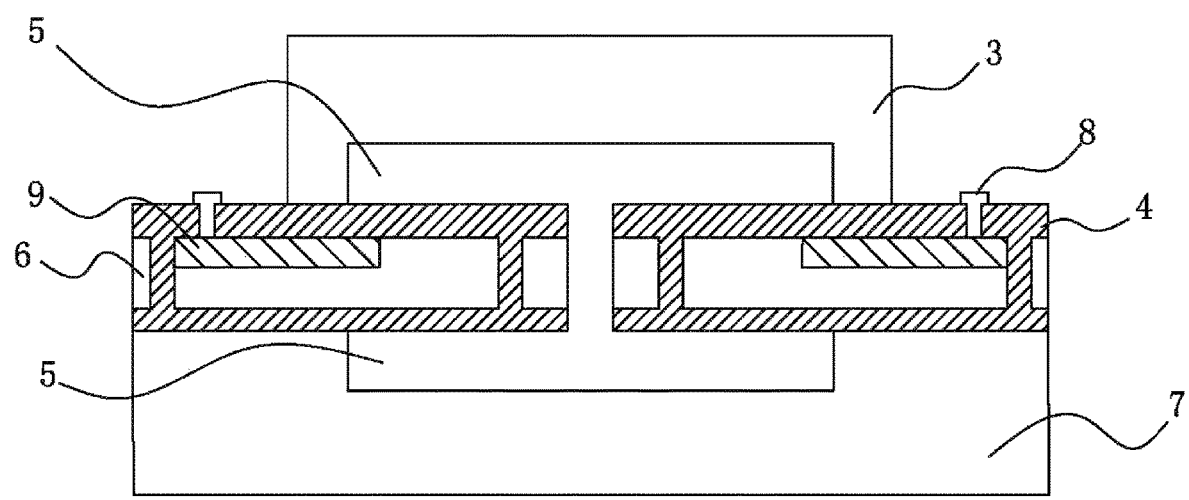

With reference to FIG. 7, preferably, piezoresistive sensing elements R1 to R4 are electrically connected in a Wheatstone bridge configuration. A constant current source 24 supplies the current going through the Wheatstone bridge. The external strain can be calculated by measuring the voltage difference between points V+ and V□. When the strain gauge die is not subjected to external strain, the piezoresistive sensing elements R1 to R4 are unstrained and their resistances are almost identical; the voltage difference between points V+ and V□ is then close to zero. On the other hand, when an external strain is applied to the strain gauge die, the strains induced in piezoresistive sensing elements R2 and R4 result in a resistance change, and a voltage difference develops between points V+ and V□. A major advantage of the Wheatstone bridge configuration is the reduction of common-mode errors which in many cases can be comparable in magnitude to the full scale strain signal. For example, as the temperature changes, the resistances of all four piezoresistive sensing elements change by about the same amount. As a result, when there is no external strain, the voltage between points V+ and V□ remains close to zero, and the Wheatstone bridge stays balanced. In the present invention, the Wheatstone bridge can be powered by a constant voltage source or a constant current source, but a constant current source is preferred because the negative temperature coefficient of silicon piezoresistive effect is partially offset by the positive temperature coefficient of resistance, resulting in an overall reduced scale factor error over temperature. Furthermore, the bridge voltage, represented by Vb which can be measured, contains temperature information which is useful for further temperature error correction.

With reference to FIGS. 1 and 3, the preferable size of the present strain gauge die is approximately 2.5 mm in length, 1.5 mm in width and 0.6 mm in thickness. The internal cavity measures approximately 1 mm in length, 0.5 mm in width and 0.1 mm in height, and device layer 2 is approximately 20 μm in thickness. In one hand, these dimensions will not significantly perturb the state of the strains on the object to be measured. On the other hand, an 8 inch silicon wafer can contain thousands to over 10,000 gross strain gauge dice, thus resulting in a significant reduction in die cost in manufacturing. It should be noted that the foregoing dimensions of the preferred embodiment are for illustrative purposes only. The present invention is not limited to this embodiment and all dimensions can be tailored for a particular design.

By using the SOI wafer construction, and further providing the device layer 2 within the vacuum sealed recess cavity formed by recesses 5 in handle 1 and cap 3, and by wrapping each piezoresistive sensing element 23 with silicon oxide insulator, the measurement accuracy and reliability of the present strain gauge die are significantly increased. The strain gauge die is also capable of operating at a temperature reaching 250° C. and measuring strain in the range of ±0.2%.

FIG. 4 illustrates one embodiment of the present invention. In this embodiment, only one bridge 21 is formed on device layer 2. It therefore senses the normal strain along the longitudinal direction of bridge 21.

FIG. 6 further illustrates the second embodiment of the present invention. In this embodiment, two mutually perpendicular bridges 21 and four cantilevers 22 are provided. Similar to the first embodiment, the piezoresistive sensing elements 23 provided on cantilevers 22 are used for reducing temperature and other common mode measurement errors, whereas the four piezoresistive sensing elements 23 provided on the two bridges 21 are used to sense the normal strains along two mutually perpendicular directions.

Regarding the silicon piezoresistance effect, the exact magnitude of electrical resistivity change further varies with the dopant type (p or n), doping concentration, and crystallographic orientation since single crystalline silicon is anisotropic, the details for which are described in Y. Kanda, "A Graphical Representation of the Piezoresistance Coefficients in Silicon," IEEE Transactions on Electron Devices, vol. ED-29, no. 1, pp. 64-70, 1982. It is desirable to pick a crystallographic orientation along which the silicon piezoresistance effect is at a maximum. For p-type device layer 2, a commonly used orientation is by having the longitudinal resistor segments oriented along a <110> direction and device layer 2 realized on a {100} plane of crystalline silicon. Another possible orientation is by having the longitudinal resistor segments oriented along a <110> or <111> direction while the device layer 2 is on a {110} plane. For n-type device layer 2, the preferred orientation is by having the longitudinal resistor segments oriented along a <100> direction while the device layer 2 is on a {100} or {110} plane. One particular advantage with these orientations is that the shear piezoresistive coefficients are zero, which means that the piezoresistive sensing resistors 23 are insensitive to shear stresses, even if they are present on bridge 21 and cantilevers 22. Other crystallographic orientations of the piezoresistive sensing elements 23 and device layer 2 are also feasible, e.g., by referring to Y. Kanda's description.

Next, the fabrication technique for the strain gauge die is described with reference to FIGS. 8 to 11. This fabrication technique can be applied to both structures disclosed in the first and second embodiment. As described above, the strain gauge die is fabricated on an SOI wafer that comes with an internal cavity formed early in the fabrication process. This cavity-SOI wafer comprises a top silicon layer 6, a buried silicon oxide layer 4, and a bottom silicon layer 7. Recesses 5 are first etched on the bottom silicon wafer which constitutes bottom silicon layer 7, before the bottom silicon wafer is bonded to the top silicon wafer. The bonded top silicon wafer is then thinned down to the desired thickness to form top silicon layer 6 of the cavity-SOI wafer. The strain gauge die in the present invention therefore employs the aforementioned cavity-SOI wafer as the starting material, followed by additional process steps as described in below.

Step 1, form a layer of silicon oxide 4 on the cavity-SOI wafer by means of thermal oxidation or chemical vapor deposition method.

Step 2, using photolithography, first coat a layer of photoresist on the cavity-SOI wafer. Then expose the photoresist according to certain mask pattern. The exposed photoresist is then dissolved away with a developer, leaving the unexposed photoresist which is subsequently hard baked. This way the mask pattern is transferred onto the photoresist on the silicon oxide layer 4. Then using ion implantation, the exposed areas on the silicon oxide layer 4 is implanted with a dopant ion with sufficient energy to penetrate the silicon oxide layer 4 reaching the top silicon layer 6. Meanwhile, the ions are stopped by the hard-baked photoresist in the unexposed areas and will not reach the top silicon layer 6. This way, selective areas on top silicon layer 6 are implanted with dopant ions, which subsequently form highly conductive regions 9 in which the electrical resistance is greatly reduced. If the top silicon layer 6 is of p-type, then a p-type dopant, such as boron ion, can be used. If the top silicon layer 6 is of n-type, then an n-type dopant, such as phosphorus ion, can be used. Lastly, the photoresist is removed. In addition to the ion implantation method, the dopant can also be introduced by a high temperature diffusion technique.

Step 3, using photolithography, transfer a mask pattern onto a layer of photoresist on the cavity-SOI wafer. Then etch the silicon oxide layer 4 using wet or dry etching to form several trenches 10 reaching down to the top silicon layer 6. Then further etch the trenches 10 from the top silicon layer 6 down to buried silicon oxide layer 4 using deep reactive ion etching or other dry or wet etching methods to form piezoresistive sensing elements 23.

Step 4, use thermal oxidation or chemical vapor deposition method to form a silicon oxide layer 4 that fills trenches 10. As a result, the piezoresistive sensing elements 23 are completely wrapped around by a layer of silicon oxide insulation.

Step 5, using photolithography, transfer a mask pattern onto a layer of photoresist on the cavity-SOI wafer. Then etch the exposed areas of silicon oxide layer 4 using wet or dry etching; thus forming multiple contact holes 8 reaching down onto the highly doped areas 9 in the top silicon layer 6. Deposit metal on the cavity-SOI wafer and inside contact holes 8. Then use photolithography and metal etching process to form metal interconnection patterns from said contact holes 8 to peripheral bond pads.

Step 6, using photolithography, transfer a mask pattern onto a layer of photoresist on the cavity-SOI wafer. Then etch silicon oxide layer 4 by using dry or wet etching to form trenches 10 reaching down to top silicon layer 6. Further etch top silicon layer 6 inside the trenches 10 down to buried silicon oxide layer 4 using deep reactive ion etching or other etching methods. Continue the etch through buried silicon oxide layer 4 in the trenches 10 using dry reactive ion etching or dry plasma etching, thereby punching into the buried cavity in bottom silicon layer 7 and by which forming freely suspended bridge 21 and cantilevers 22. Lastly, remove the photoresist using dry plasma etching.

Step 7, bond the cap silicon wafer preprocessed with recess 5 with the processed cavity-SOI wafer in vacuum to form the vacuum sealed cavity. The bonding technique includes silicon fusion bonding, eutectic bonding, solder bonding, and anodic bonding.

Step 8, grind and dice the bonded silicon wafer into complete MEMS strain gauge dice.

The etching methods are selected from one or more of the following methods: dry etching or wet etching; the dry etching for silicon comprises deep reactive ion etching, reactive ion etching, and gaseous xenon difluoride etching; and the dry etching for silicon oxide comprises reactive ion etching, plasma etching, and hydrofluoric acid vapor etching.

The wet etching of silicon comprises one kind or a combination of the following etchants: potassium hydroxide, tetramethylammonium hydroxide or ethylenediamine pyrocatechol.

The wet etching of silicon oxide comprises one kind or a combination of the following etchants: hydrofluoric acid or buffered hydrofluoric acid.

In the present invention, the piezoresistive sensing elements are placed inside a vacuum sealed cavity. This reduces the undesirable influence from the external environment and foreign materials, and increases the reliability and accuracy of the strain gauge die. Moreover, each piezoresistive sensing element is completely wrapped around and isolated by a layer of silicon oxide insulator. This reduces crosstalk and interference between sensing elements. Such dielectric isolation scheme also enables the present strain gauge die to operate at high temperature. Furthermore, connecting the piezoresistive sensing elements in a Wheatstone bridge configuration is the key to reduce common-mode errors and temperature effects. Finally, manufacturing the strain gauge die on an SOI wafer using microfabrication techniques not only solves the material mismatch problem in the thermal expansion coefficients, it also significantly reduces the manufacturing cost of the strain gauge die. As described above, a single 8-inch SOI wafer can produce thousands to over 10,000 MEMS strain gauge dice.

Lastly, it will be appreciated by those of ordinary skill in the art that many variations in the foregoing preferred embodiments are possible while remaining within the scope of the present invention. The present invention should thus not be considered limited to the preferred embodiments or the specific choices of materials, configurations, dimensions, applications or ranges of parameters employed therein.

The invention claimed is:
1. A MEMS strain gauge die, comprising:
a handle, a device layer and a cap all connected together;
a first silicon oxide layer formed between said handle and said device layer;
a second silicon oxide layer formed between said device layer and said cap;
a handle recess formed on said handle;
a cap recess formed on said cap, said handle recess and said cap recess are connected to form a cavity;
said device layer, which is provided within said cavity, includes a bridge having a first plurality of piezoresistive sensing elements formed on said bridge, and a cantilever having a second plurality of piezoresistive sensing elements formed on said cantilever, each of said piezoresistive sensing elements having a silicon oxide insulating layer formed on a top, a bottom and along sides thereof.
2. The strain gauge die according to claim 1, wherein the bridge has two ends that are connected to opposite sides of said cavity.
3. The strain gauge die according to claim 1, wherein said device layer includes at least one said bridge and one pair of said cantilevers, said cantilevers are parallel to said bridge; two piezoresistive sensing elements are formed on said bridge and one piezoresistive sensing element is formed on each said cantilever.
4. The strain gauge die according to claim 3, wherein said piezoresistive sensing elements are electrically connected in a Wheatstone bridge configuration.
5. The strain gauge die according to claim 1, wherein said device layer includes at least two said bridges mutually perpendicular to each other; and two piezoresistive sensing elements are formed on each said bridge.
6. The strain gauge die according to claim 5, wherein said device layer further includes at least one said cantilever; said piezoresistive sensing element is formed on said cantilever.
7. The strain gauge die according to claim 6, wherein said piezoresistive sensing elements are electrically connected in a Wheatstone bridge configuration.
8. The strain gauge die according to claim 1, wherein metal contacts are provided at end point terminals of said piezoresistive sensing element.
9. The strain gauge die according to claim 1, wherein said strain gauge die uses a silicon-on-insulator construction;

said silicon-on-insulator construction comprises a top silicon layer, a bottom silicon layer, and a buried silicon oxide layer; a cavity is formed in said bottom silicon layer;

wherein said handle is formed in said bottom silicon layer, said device layer is formed in said top silicon layer, and said buried silicon oxide layer is formed between said top silicon layer and said bottom silicon layer.

10. The strain gauge die according to claim 9, wherein said device layer is formed on a {100} crystallographic plane of p-type silicon, said piezoresistive sensing element is oriented along a <110> crystallographic direction.

11. The strain gauge die according to claim 9, wherein said device layer is formed on a {100} crystallographic plane of n-type silicon, said piezoresistive sensing element is oriented along a <100> crystallographic direction.

12. The strain gauge die according to claim 9, wherein said device layer is formed on a {110} crystallographic plane of p-type silicon, said piezoresistive sensing element is oriented along a <110> or <111> crystallographic direction.

13. The strain gauge die according to claim 9, wherein said device layer is formed on a {110} crystallographic plane of n-type silicon, said piezoresistive sensing element is oriented along a <100> crystallographic direction.

14. The strain gauge die according to claim 9, wherein said device layer is formed on a {111} crystallographic plane of p-type silicon.

15. A MEMS strain gauge die fabrication process comprising the following sequential steps:
   grow or deposit a silicon oxide layer on the top surface and the bottom surface of a silicon-on-insulator wafer which was prefabricated with buried cavities in the bottom silicon layer;
   using photolithography and ion implantation, form highly conductive regions, which are highly doped, on said top silicon layer;
   using photolithography and etching, etch trenches through said top silicon layer reaching said buried silicon oxide layer to form said piezoresistive sensing elements;
   grow or deposit a layer of silicon oxide to fill said trenches;
   using photolithography and etching, etch contact holes through said silicon oxide layer on top of said highly conductive regions reaching said top silicon layer;
   using metal deposition, photolithography and etching, form metal interconnection patterns from said contact holes to peripheral bond pads;
   using photolithography and etching, etch trenches through said top silicon layer and said buried silicon oxide layer punching into said buried cavities in said bottom silicon layer, thus forming said freely suspended bridges and cantilevers;
   bond a cap silicon wafer which was prefabricated with recesses to said silicon-on-insulator wafer; and
   using wafer dicing, cut the bonded silicon wafer into individual MEMS strain gauge dice.

16. The MEMS strain gauge die fabrication process according to claim 15, wherein the fabrication process for said recesses in said cap silicon wafer includes photolithography and etching.

17. The MEMS strain gauge die fabrication process according to claim 15, wherein said etching method includes one kind or a combination of dry and wet etching methods; said dry etching method is selected from one or more of the following methods: deep reactive ion etching, reactive ion etching, or gaseous xenon difluoride etching for silicon; as well as reactive ion etching, plasma etching, or hydrofluoric acid vapor etching for silicon oxide.

18. The MEMS strain gauge die fabrication process according to claim 15, wherein said wet etching method for silicon includes one kind or a combination of the following etchants: potassium hydroxide, tetramethylammonium hydroxide, or ethylenediamine pyrocatechol.

19. The MEMS strain gauge die fabrication process according to claim 15, wherein said wet etching method for silicon oxide includes one kind or a combination of the following etchants: hydrofluoric acid or buffered hydrofluoric acid.

20. The strain gauge die according to claim 1 wherein a silicon dioxide insulation layer is formed on a top, a bottom and along sides of said piezoresistive sensing element.

* * * * *